(12) United States Patent
Mitchell et al.

(10) Patent No.: US 7,147,041 B2
(45) Date of Patent: Dec. 12, 2006

(54) LIGHTWEIGHT HEAT SINK

(75) Inventors: Jonathan E. Mitchell, East Falmouth, MA (US); Michael H. Bunyan, Chelmsford, MA (US)

(73) Assignee: Parker-Hannifin Corporation, Cleveland, OH (US)

( * ) Notice: Subject to any disclaimer, the term of this patent is extended or adjusted under 35 U.S.C. 154(b) by 0 days.

(21) Appl. No.: 11/046,143

(22) Filed: Jan. 28, 2005

(65) Prior Publication Data

US 2005/0241801 A1    Nov. 3, 2005

Related U.S. Application Data

(60) Provisional application No. 60/567,745, filed on May 3, 2004.

(51) Int. Cl.
*F28F 3/02* (2006.01)

(52) U.S. Cl. ..................... 165/80.3; 165/185

(58) Field of Classification Search ........... 361/697, 361/692, 710, 709, 705; 165/80.3, 185
See application file for complete search history.

(56) References Cited

U.S. PATENT DOCUMENTS

| | | | |
|---|---|---|---|
| 3,749,156 A * | 7/1973 | Fletcher et al. ............. 165/276 |
| 3,821,463 A | 6/1974 | Bakker | |
| 3,928,907 A | 12/1975 | Chisholm | |
| 4,299,715 A | 11/1981 | Whitfield et al. | |
| 4,466,483 A | 8/1984 | Whitfield et al. | |
| 4,473,113 A | 9/1984 | Whitfield et al. | |
| 4,602,678 A | 7/1986 | Fick | |
| 4,606,962 A | 8/1986 | Reylek et al. | |
| 4,654,754 A | 3/1987 | Daszkowski | |
| 4,685,987 A | 8/1987 | Fick | |
| 4,764,845 A | 8/1988 | Artus | |
| 4,782,893 A | 11/1988 | Thomas | |
| 4,842,911 A | 6/1989 | Fick | |
| 4,869,954 A | 9/1989 | Squitieri | |
| 4,965,699 A | 10/1990 | Jorden et al. | |
| 4,974,119 A | 11/1990 | Martin | |
| 4,979,074 A | 12/1990 | Morley et al. | |
| 5,060,114 A | 10/1991 | Feinberg et al. | |
| 5,137,959 A | 8/1992 | Block et al. | |
| 5,151,777 A | 9/1992 | Akin et al. | |
| 5,167,851 A | 12/1992 | Jamison et al. | |
| 5,194,480 A | 3/1993 | Block et al. | |
| 5,213,868 A | 5/1993 | Liberty et al. | |

(Continued)

FOREIGN PATENT DOCUMENTS

GB        740918        11/1995

(Continued)

OTHER PUBLICATIONS

Chomerics Technical Bulletin 67, copyrighted 1999 entitled "Thermattach® T413 and T414 Thermally Conductive Adhesive Tapes for Heat Spreader to Circuit Board Attachment."

(Continued)

*Primary Examiner*—Teresa J. Walberg
(74) *Attorney, Agent, or Firm*—John A. Molnar, Jr.

(57) ABSTRACT

A heat sink disposable on a heat transfer surface of a heat-generating source such as an electronic component. The heat sink includes a base portion and a body portion. The base portion has a first surface disposable on the heat transfer surface, and a second surface opposite the first surface. The body portion is joined to the second surface of the base portion and is formed of a stack of corrugated sheets of one or more metal foils arranged to form a cellular, honeycomb-like structure.

35 Claims, 2 Drawing Sheets

U.S. PATENT DOCUMENTS

| | | | |
|---|---|---|---|
| 5,250,209 A | 10/1993 | Jamison et al. | |
| 5,298,791 A | 3/1994 | Liberty et al. | |
| 5,304,846 A | 4/1994 | Azar et al. | |
| 5,309,320 A | 5/1994 | Smith | |
| 5,321,582 A | 6/1994 | Casperson | |
| 5,359,768 A | 11/1994 | Haley | |
| 5,471,027 A | 11/1995 | Call et al. | |
| 5,486,980 A | 1/1996 | Jordan et al. | |
| 5,510,174 A | 4/1996 | Litman | |
| 5,545,473 A | 8/1996 | Ameen et al. | |
| 5,550,326 A | 8/1996 | Kesel | |
| 5,666,261 A * | 9/1997 | Aguilera | 361/681 |
| 5,679,457 A | 10/1997 | Bergerson | |
| 5,766,740 A | 6/1998 | Olson | |
| 5,798,171 A | 8/1998 | Olson | |
| 5,895,885 A | 4/1999 | Kunkel | |
| 5,910,639 A | 6/1999 | Kunkel | |
| 6,003,591 A * | 12/1999 | Campbell | 165/104.26 |
| 6,054,198 A | 4/2000 | Bunyan et al. | |
| 6,096,414 A | 8/2000 | Young | |
| 6,097,602 A * | 8/2000 | Witchger | 361/705 |
| 6,269,002 B1 | 7/2001 | Azar | |
| 6,478,082 B1 * | 11/2002 | Li | 165/185 |
| 6,523,608 B1 | 2/2003 | Solbrekken et al. | |
| 6,650,215 B1 | 11/2003 | Gundale | |
| 6,680,847 B1 * | 1/2004 | Heard | 361/692 |
| 6,705,388 B1 * | 3/2004 | Sorgo | 165/80.3 |
| 2002/0135984 A1 | 9/2002 | Greenwood et al. | |
| 2003/0152764 A1 | 8/2003 | Bunyan et al. | |
| 2003/0203188 A1 | 10/2003 | Bunyan | |
| 2004/0031587 A1 * | 2/2004 | Fong | 165/80.3 |
| 2004/0094293 A1 * | 5/2004 | Mita et al. | 165/185 |
| 2005/0039884 A1 | 2/2005 | Pawlenko et al. | |
| 2005/0236142 A1 * | 10/2005 | Boudreaux | 165/80.3 |

FOREIGN PATENT DOCUMENTS

| | | |
|---|---|---|
| JP | 06288732 | 5/1996 |
| JP | 08250878 | 9/1996 |
| JP | 09055458 | 2/1997 |
| JP | 2002329989 | 11/2002 |
| WO | 96/37915 | 11/1996 |
| WO | 00/36893 | 6/2000 |
| WO | 02/059965 | 8/2002 |

OTHER PUBLICATIONS

Chomerics Technical Bulletin 72, copyrighted 1999 entitled "Thermattach® T404, T405 and T412 Thermally Conductive Adhesive Tapes for Heat Attachment to Ceramic or Metal Components."

Chomerics Technical Bulletin 79, copyrighted 1999 entitled "Thermattach® T410 and T411 Thermally Conductive Tapes for Heat Sink Attachment to BGAs and other Plastic Encapsulated Components."

U.S. Appl. No. 60/567,745, filed May 3, 2004, Michael H. Bunyan et al., Lightweight Heat Sink.

The Notification of Transmittal of the International Search Report and the Written Opinion of the International Searching Authority or the Declaration in corresponding International Application No. PCT/US2005/002758.

* cited by examiner

US 7,147,041 B2

LIGHTWEIGHT HEAT SINK

CROSS-REFERENCE TO RELATED CASES

The present application claims the benefit of the filing date of U.S. Provisional Application Ser. No. 60/567,745; filed May 3, 2004, the disclosure of which is expressly incorporated herein by reference.

BACKGROUND OF THE INVENTION

The present invention relates broadly to thermal management devices for electronic components, such as integrated circuit (IC) chips. More particularly, the invention relates to a thermal dissipator, i.e., heat sink, for attachment to the heat transfer surface of an electronic component for the conductive and/or convective cooling of the component.

Circuit designs for modem electronic devices such as televisions, radios, computers, medical instruments, business machines, communications equipment, and the like have become increasingly complex. For example, integrated circuits have been manufactured for these and other devices which contain the equivalent of hundreds of thousands of transistors. Although the complexity of the designs has increased, the size of the devices has continued to shrink with improvements in the ability to manufacture smaller electronic components and to pack more of these components in an ever smaller area.

As electronic components such as IC semiconductor chips or dies have become smaller and, in turn, more densely packed on printed circuit boards (PCBs), designers and manufacturers now are faced with the challenge of how to dissipate the heat which is ohmicly or otherwise generated by these components. Indeed, it is well known that many electronic components, and especially power semiconductor components such as transistors and microprocessors, are more prone to failure or malfunction at high temperatures. Thus, the ability to dissipate heat often is a limiting factor on the performance of the component.

In basic construction, and as is described in U.S. Pat. Nos. 5,488,254 and 5,359,768, semiconductor chips or dies typically are packaged by encapsulation in a ceramic or plastic chip carrier. External connections provided on the chip carrier allow for the chip to be mounted onto a PCB by wire bonding electrical leads on the carrier through a common mounting surface on the board, or by surface mounting the carrier directly to the mounting surface of the board. Recently, the industry trend has been away from ceramic chip carrier packages and toward plastic packages. Usually molded of an engineering thermoplastic material such as polyethylene terephthalate (PETP), polyphenylene sulfide (PPS), polyetherimide (PEI), polyetherether ketone (PEEK), polyetherketone (PEK), or polyimide (PI), or a thermosetting material such as an epoxy or an epoxy-phenolic composite, these plastic chip packages typically are less expensive than their ceramic counterparts. However, these plastic materials generally exhibit less efficient heat transfer characteristics as compare to other package materials, and therefore may raise additional thermal dissipation considerations.

Electronic components within integrated circuits traditionally have been cooled via forced or convective circulation of air within the housing of the device. In this regard, cooling fins have been provided as an integral part of the component package or as separately attached thereto for increasing the surface area of the package exposed to convectively-developed air currents. Electric fans additionally have been employed to increase the volume of air which is circulated within the housing. For high power circuits and the smaller but more densely packed circuits typical of current electronic designs, however, simple air circulation often has been found to be insufficient to adequately cool the circuit components. One approached has been to design integral metal or ceramic heat sinks into the die package or mounting assembly, such as is shown, for example, in U.S. Pat. Nos. 5,175,612; 5,608,267; 5,605,863; 5,525,835; 5,560,423; and 5,596,231.

Heat dissipation beyond that which is attainable by simple air circulation may be effected by the direct mounting of the electronic component to a thermal dissipation member such as a "cold plate" or other heat sink. The heat sink may be a dedicated, thermally-conductive metal plate, or simply the chassis or circuit board of the device. To improve the heat transfer efficiency through the interface, a layer of a thermally-conductive interface material typically is interposed between the heat sink and electronic component to fill in any surface irregularities and eliminate air pockets. Initially employed for this purpose were materials such as silicone grease or wax filled with a thermally-conductive filler such as aluminum oxide, magnesium oxide, zinc oxide, boron nitride, and aluminum nitride. Such thermal interface materials usually are semi-liquid or solid at normal room temperature, but may liquefy or soften at elevated temperatures to flow and better conform to the irregularities of the interface surfaces.

Alternatively, another approach is to substitute a cured, sheet-like material in place of the silicone grease or wax. Thermal interface materials of this type may be compounded as containing one or more thermally-conductive particulate fillers dispersed within a polymeric binder, and may be provided in the form of cured sheets, tapes, pads, or films. Typical binder materials include silicones, urethanes, thermoplastic rubbers, and other elastomers, with typical fillers including aluminum oxide, magnesium oxide, zinc oxide, boron nitride, and aluminum nitride. Materials of this type are further described in U.S. Pat. Nos. 6,096,414; 5,545,473; 5,533,256; 5,510,174; 5,471,027; 5,298,791; 5,213,868; 5,194,480; 5,137,959; 5,060,114; 4,979,074; 4,974,119; 4,869,954; 4,654,754; and 4,606,962, and in WO9637915.

More recently, thermal interface materials of a phase-change type, more commonly known as phase-change materials ("PCM's"), have been introduced which are self-supporting and form-stable at room temperature for ease of handling, but which liquefy or otherwise soften at temperatures within the operating temperature range of the electronic component to form a viscous, thixotropic phase which better conforms to the interface surfaces. These PCM's, which may be supplied as free-standing films, or as heated screen printed onto a substrate surface, advantageously function much like greases and waxes in conformably flowing within the operating temperature of the component under relatively low clamping pressures of about 5 psi (35 kPa). Such materials are further described, for example, in U.S. Pat. Nos. 6,054,198 and 6,523,608, and in US20030203188; US20030152764; US20020135984; WO0036893; and WO02059965.

Yet another approach for the cooling of electronic components, and particularly components that are densely packed on a circuit board, involves the use of a metal foil thermal dissipator. As is detailed in commonly-assigned U.S. Pat. No. 5,550,326, such dissipator includes a lightweight, thermal dissipation layer formed of a relatively thin, e.g., 1–30 mil, and flexible copper or other metal foil sheet, and an attached pressure-sensitive adhesive pad for bonding the foil sheet to a surface of the electronic component. As compared to more conventional cast or extruded metal plate, fin, pin, or other heat sinks, such as those shown in U.S. Pat. Nos. 6,650,215; 6,269,002; 5,486,980; 5,381,859; 5,304,846; 5,294,831; 5,241,452; 5,107,330; 5,049,981; 4,953,634; 4,765,397; and 4,703,339, such dissipator is lighter and less expensive, has a lower profile to accommodate different mounting opportunities even in a relatively confined spaces, eliminates the need for a clip or other mechanical attachment means, and is readily removable for repair or replacement of the component. Dissipators of such type are marketed commercially under the name T-Wing™, by the Chomerics Division of Parker-Hannifin Corp., Woburn, Mass., as including a 7 mil (0.175 mm) thick sheet of copper foil which is laminated on both sides with an electrically-insulating polymeric film laminated on both sides. A 2–3 mil (0.051 mm) thick silicone pressure sensitive adhesive pad is affixed to on side of the foil sheet for the attachment of the dissipator to the surface of the die package. A variation of the above-described metal foil dissipator, as further described in commonly-assigned U.S. Pat. No. 6,705,388, uses a thin ceramic tile instead of the foil.

In view of proliferation of electronic devices, it will be appreciated that improvements in the design of thermal dissipators therefor would be well-received. Especially desired would be a heat sink which is efficient, yet inexpensive and easy to use.

The present invention is directed to a heat sink construction which is not only low in cost and light in weight, but which is also efficient as well as conformable to accommodate both micro irregularities and macro curvatures and other deviations in planarity in the electronic package or other surface to which the heat sink may be attached.

In an illustrative embodiment, the heat sink includes a base portion for attachment to the electronic package or other surface, and a cellular, radiator-like body portion which is bonded or otherwise joined to a surface of the base portion. The base portion may be formed, broadly, of one or more sheets, pads, or other layers of a thermal interface material. Such material may be formulated, for example, as a pressure-adhesive or other inherently tacky or otherwise self-adhesive composition which may rendered thermally conductive via its loading with one or more thermally-conductive particulate fillers such as aluminum oxide, magnesium oxide, zinc oxide, boron nitride, or aluminum nitride. The composition, which additionally may be formulated as a PCM, may be impregnated or otherwise supported in or on a reinforcement or other carrier such as a layer of a plastic or thermoplastic film, fiberglass or other fiber fabric, cloth, or web, metal foil, metal screen or other mesh such as, particularly, an expanded metal mesh. In the case of a metal foil or mesh, the carrier itself may render the composition, which in such instance may be filled or unfilled, thermally conductive in the case of an unfilled composition, or further thermally conductive in the case of a filled composition.

The body portion may be formed of a honeycomb-like material having a hexagonal or other open cellular structure which may be formed from a stack of sheets of metal foil, each of which sheets is corrugated along a longitudinal or lengthwise extent of the sheet to form, relative to a transverse or widthwise extent extending normal to the longitudinal extent, an alternating series of crests and troughs. The lengthwise extents of each of the crests of the sheets in the stack are bonded or otherwise joined, such as with an adhesive or solder, or by laser or spot welding, along the lengthwise extent of a corresponding trough of an adjacent sheet in the stack along a series of bondlines, with such bondlines between adjacent pairs of sheets being staggered. Laid-up and bonded as described, the stack forms an integral, lightweight, honeycomb-like cellular structure.

When employed in the heat sink of the present invention, such honeycomb structure provides a large surface area for convective or other dissipation of heat transferred through the base portion. By virtue of its light weight, such structure also results in a heat sink which resists shear and other forces which could cause it, in service such as in a laptop, cell phone, or other portable device, to detach from the electronic package to which it is bonded. Such structure, moreover, allows the network to exhibit a degree a flexibility or "spring" which allows the honeycomb to bend or otherwise conform with the base to accommodate curvatures and other deviations in planarity in the electronic package or other surface to which the base portion may be attached.

For optimum heat transfer efficiency, the structure of the honeycomb network may be oriented relative to the base portion such that the transverse extent of each of the sheets extends generally normal to the base portion. In this way, direct thermal pathways may be effected from the base along each of the individual foil sheets in the honeycomb, i.e., without the pathways having to cross the bondlines which otherwise would result in increased thermal impedance.

Advantages of the present invention include a lightweight, low cost, and efficient heat sink. Additional advantages include a heat sink which is conformable to electronic packages and other surfaces which may have curvatures or other deviations from planar. These and other advantages will be readily apparent to those skilled in the art based upon the disclosure contained herein.

BRIEF DESCRIPTION OF THE DRAWINGS

For a fuller understanding of the nature and objects of the invention, reference should be had to the following detailed description taken in connection with the accompanying drawings wherein.

Figure 1:
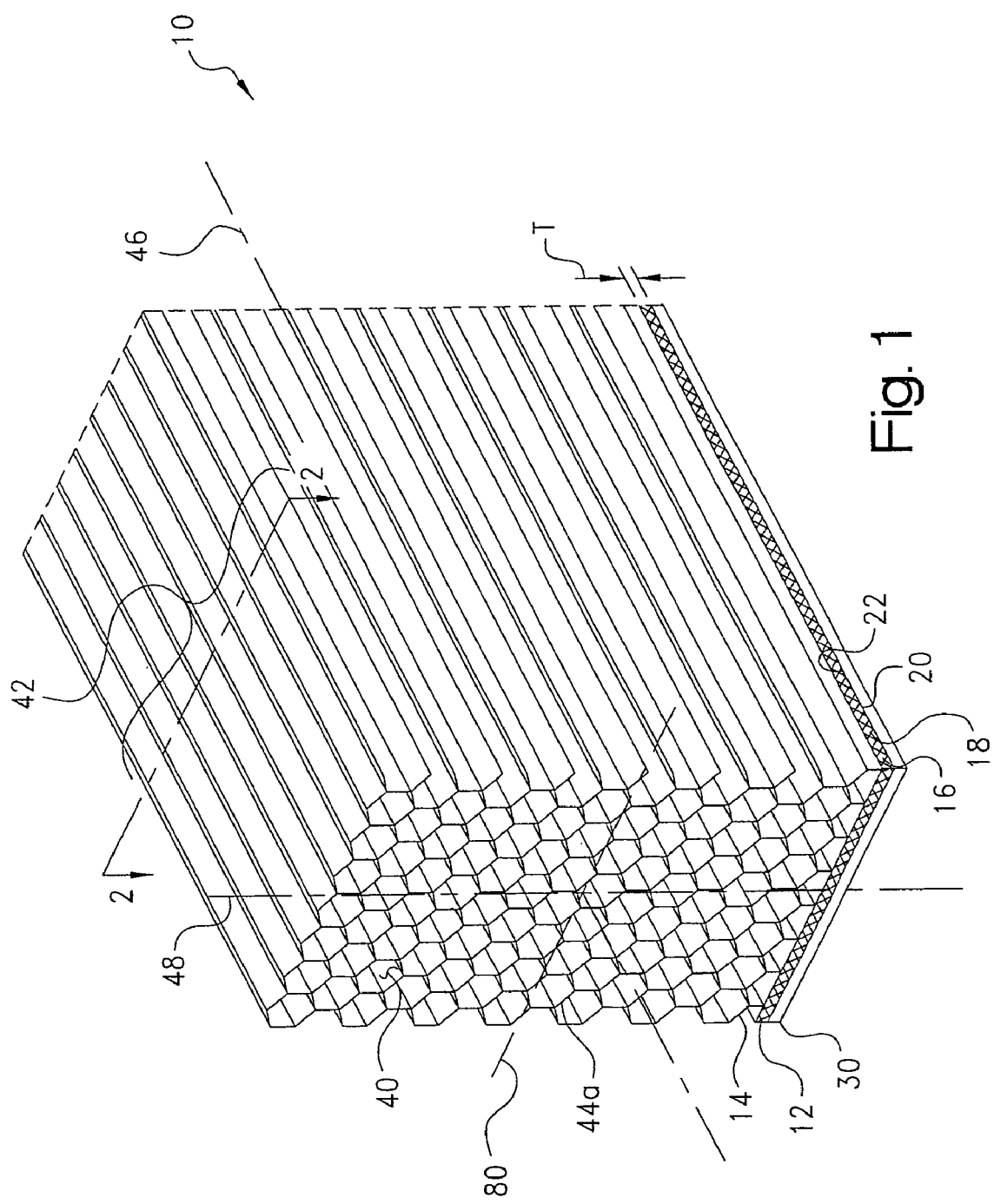
FIG. 1 is a perspective view of a representative heat sink construction in accordance with the present invention.

The drawings will be described further in connection with the following Detailed Description of the Invention.

DETAILED DESCRIPTION OF THE INVENTION

Certain terminology may be employed in the following description for convenience rather than for any limiting purpose. For example, the terms "forward" and "rearward," "front" and "rear," "right" and "left," "upper" and "lower," "top" and "bottom," and "right" and "left" designate directions in the drawings to which reference is made, with the terms "inward," "inner," "interior," or "inboard" and "outward," "outer," "exterior," or "outboard" referring, respectively, to directions toward and away from the center of the referenced element, the terms "radial" or "vertical" and "axial" or "horizontal" referring, respectively, to directions or planes perpendicular and parallel to the longitudinal central axis of the referenced element. Terminology of similar import other than the words specifically mentioned above likewise is to be considered as being used for purposes of convenience rather than in any limiting sense.

In the figures, elements having an alphanumeric designation may be referenced herein collectively or in the alternative, as will be apparent from context, by the numeric portion of the designation only. Further, the constituent parts of various elements in the figures may be designated with separate reference numerals which shall be understood to refer to that constituent part of the element and not the element as a whole. General references, along with references to spaces, surfaces, dimensions, and extents, may be designated with arrows or underscores.

For the illustrative purposes of the discourse to follow, the heat sink construction of the invention herein involved is described in connection with its use within a thermal management assembly as adhered or otherwise mounted on a surface of a package for a heat-generating electronic component. Such assemblies are elsewhere described in U.S. Pat. Nos. 6,096,414; 6,054,198; 5,798,171; 5,766,740; 5,679,457; 5,545,473; 5,533,256; 5,510,174; 5,471,027; 5,359,768; 5,321,582; 5,309,320; 5,298,791; 5,250,209; 5,213,868; 5,194,480; 5,137,959; 5,167,851; 5,151,777; 5,060,114; 4,979,074; 4,974,119; 4,965,699; 4,869,954; 4,842,911; 4,782,893; 4,764,845; 4,685,987; 4,654,754; 4,606,962; 4,602,678; 4,473,113; 4,466,483; 4,299,715; and 3,928,907. It will be appreciated, however, that aspects of the present invention may find use in other thermal management applications. Such uses and applications therefore should be considered to be expressly within the scope of the present invention.

Referring then to the figures wherein corresponding reference characters are used to designate corresponding elements throughout the several views with equivalent elements being referenced with prime or sequential alphanumeric designations, a heat sink construction according to the present invention is depicted generally at 10 in FIG. 1. In basic construction, heat sink 10 includes a base portion, 12, for attachment to a heat transfer surface such as the package of an electronic component and a cellular, radiator-like body portion, 14, which is bonded or otherwise joined to the base portion 12.

Base portion 12, which may have a thickness, referenced at "T," of between about 1–10 mils (25.4–254 µm), and which may be square, round, or of any geometric shape which may mirror the shape of the heat transfer surface to which it will be attached, may be provided in the form of, or as formed from, a sheet, pad, roll, tape, die-cut part, or other thermally-conductive layer, 16, of a thermal-conductive compound or other composition or material which optionally may be supported on a carrier or reinforcement, 18. Overall, base portion 12 may exhibit a thermal impedance, such as in accordance with ASTM D5470, of less than about 1° C.-in$^2$/W (6° C.-cm$^2$/W), and typically less than about 0.2° C.-in$^2$/W (1.2° C.-cm$^2$/W) and preferably not more than about 0.1° C.-in$^2$/W (0.6° C.-cm$^2$/W). In the illustrated embodiment, the carrier 18 is provided as an interlayer with the layer 16 being impregnated thereon or otherwise supported thereof so as to form a first surface, 20, and an opposite second surface, 22, of the base portion 12.

The thermally-conductive compound or other composition, which may be filled or unfilled, or other material such as a metal foil, sheet, or plate, or a cured elastomer, may, in the case of a filled composition, be formulated as a blend or other admixture of a continuous phase component and a filler or other dispersed phase component. The continuous phase component itself may be a blend or other admixture of one or more resins, greases, and/or waxes. Such component further may be formulated to be inherently tacky, such as by control of solids content, surface energy, viscosity, or other physical or chemical property, to enable the layer 16 to be self-adherent at room temperature under a moderate applied pressure to the heat transfer surface of the electronic component or the like without the necessity of heating, such as in the case of a hot-melt composition, or the provision of a separate adhesive layer. Such inherently tacky resins include acrylic and silicone pressure sensitive adhesives (PSA's), as well as "low melt" resins, i.e., having a melting temperature of between about 30–60° C. As used herein, the "PSA" is ascribed its conventional meaning that the resin is formulated as having a glass transition temperature, surface energy, and other properties such that it exhibits some degree of tack at normal room temperature. Generally the continuous phase component of the layer 16 may be formulated to be substantially "form-stable" in exhibiting a gel or semi-solid like state at room temperature to be self-supporting or otherwise non-running, slumping, or sagging, such that it may be formed into sheets or pads or otherwise for application or handling. The component optionally also may be formulated as a PCM in becoming liquid, semi-liquid, or otherwise viscous at elevated temperature in a generally-thixotropic, melt-flowable-like state, provided that the heat sink 10 is otherwise secured to the electronic component, such as with a clip, clamp, screw, or other fastener.

As the name implies, the continuous phase component generally forms a binder or other continuous phase within the compound into which the filler is dispersed. The filler is included within the continuous phase component in a proportion sufficient to provide the thermal conductivity desired for the intended application, and generally will be loaded at between about 20–80% by total weight of the compound. The size and shape of the filler is not critical for the purposes of the present invention. In this regard, the filler may be of any general shape including spherical, flake, platelet, irregular, or fibrous, such as chopped or milled fibers, but preferably will be a powder or other particulate to assure uniform dispersal and homogeneous mechanical and thermal properties. The particle size or distribution of the filler typically will range from between about 0.01–10 mil (0.25–250 µm), but may further vary depending upon the thickness of layer 22. The filler preferably is selected as being electrically-nonconductive such that layer 20 may provide a dielectric or electrically-insulating, but thermally-conductive barrier when interposed between an electronic component and a thermal dissipation member. Alternatively, the filler may be electrically-conductive in applications where electrical isolation is not required.

Suitable thermally-conductive fillers include boron nitride, titanium diboride, aluminum nitride, silicon carbide, graphite, metals such as silver, aluminum, and copper, other metals such as solders and low melt allows, metal oxides such as aluminum oxide, magnesium oxide, zinc oxide, beryllium oxide, and antimony oxide, and ferrites, and mixtures or other combinations thereof. Such fillers characteristically exhibit a thermal conductivity of about 25–50 W/m-K. For reasons of economy, an aluminum oxide, i.e., alumina, may be used, while for reasons of improved thermal conductivity a boron nitride would be considered more preferred. Loaded with the thermally-conductive filler, the thermally-conductive compound of the first layer 20 typically will exhibit a thermal conductivity, per ASTM D5470, of at least about 0.5 W/m-K, and, as formed into the layer 20, a thermal impedance of less than about 0.2° C.-in$^2$/W (1.2° C.-cm$^2$/W).

Additional fillers and additives may be included in the formulation depending upon the requirements of the particular application envisioned. Such fillers and additives may include conventional wetting agents or surfactants, opacifying or anti-foaming agents, chain extending oils, tackifiers, pigments, lubricants such as molybdenum disulfide ($MoS_2$), stabilizers, flame retardants such as decabromodiphenyl oxide, antioxidants, dispersants, flow modifiers, tackifiers, film-reinforcing polymers and other agents, and inert fillers such as fumed silica. The formulation may be compounded in a conventional mixing apparatus. Typically, these fillers and additives may be blended or otherwise admixed with the formulation, and may comprise between about 0.05–80% or more by total volume thereof. Thermally-conductive materials of the types herein involved are further described in U.S. Pat. Nos. 6,523,608; 6,096,414; 6,054,198; 5,545,473; 5,533,256; 5,510,174; 5,471,027; 5,298,791; 5,213,868; 5,194,480; 5,137,959; 5,060,114; 4,979,074; 4,974,119; 4,869,954; 4,654,754; and 4,606,962, and in WO0036893; WO02059965; WO9637915; US20030203188; US20030152764; and US20020135984.

Although not necessarily required, a reinforcement or other carrier, 18, optionally may be incorporated within the filled or unfilled composition of layer 16 such as in the form of an interlayer within the layer 16. Such carrier 18 may be provided as a film formed of a thermoplastic material such as a polyimide or polyetheretherketone (PEEK), a layer of a woven or non-woven, e.g., needled, fiberglass fabric, cloth, web, or mat, or an aluminum or other metal foil, screen, or, preferably, expanded mesh. Such carrier or reinforcement may improve the physical strength of the layer 16 and base portion 12 to better facilitate handling at higher ambient temperatures and die cutting into a variety of geometries prior to or after its joining to the body portion 14. In the case of an unfilled composition, the carrier 18 itself, such as may be provided in the form of a metal foil, screen, or mesh, may render the layer thermally conductive or, in the case of a filled composition, further thermally conductive. The reinforcement or carrier typically will have a thickness of between about 0.5–5 mil (12.5–125 µm), with a thickness of about 2 mil (50 µm) being preferred for metal foils.

To the extent that the compound of the filled or unfilled composition of the layer 16 may be substantially non-tacky, i.e., having a dry or dead tack at room temperature such as in the case of a cured elastomer, a separate PSA or other adhesive layer (not shown) may be provided on one or both of the surfaces 20 and 22 as a coating or the like having a thickness, for example, of between about 0.05–2 mil (1.25–50 µm). So provided, such PSA layer or layer may be used to bond the base portion 12 to the body portion 14, and/or to bond the heat sink 10 itself to the package of the electronic component or other heat transfer surface. Such PSA layer or layer each may be formulated, independently, as a silicone or acrylic-based PSA resin optionally blended with a thermally-conductive filler. Generally, the PSA material will be selected to exhibit a lap or die shear adhesion, according to ASTM D1002 or Chomerics Test Procedure No. 54 (Parker Chomerics Division, Woburn, Mass.), respectively, of at least about 100 psi (0.7 MPa) to the substrate. Such adhesion may be developed from valence forces, mechanical interlocking action, or a combination thereof.

The acrylic-based PSA resin may be a homopolymer, copolymer, terpolymer, interpenetrating network, or blend of an acrylic or (meth)acrylic acid, an acrylate such as butyl acrylate or other alcohol ester, and/or an amide such as acrylamide. The silicone-based PSA resin may include a dry or wet film silicone resin or gum. Depending upon the formulation, the respective acrylic or silicone-based PSA constituents may form a binder into which the thermally-conductive filler is dispersed. The filler generally is loaded in the binder in a proportion sufficient to provide the thermal conductivity desired for the intended application, and may be of the type described hereinbefore in connection with layer 16.

With continuing reference to FIG. 1, for ease of handling and as a protective layer for shipping, a release liner, 30, may be provided over the PSA layer or, and as is shown, in the case of an inherently tacky compound, over the first surface 20 of the layer 16. Exemplary release liners include face stocks or other films of polyolefins, plasticized polyvinyl chloride, polyesters, cellulosics, metal foils, composites, and waxed, siliconized, or other coated paper or plastic having a relatively low surface energy to be removable. In service, the liner 30 may be removed prior to the disposition of the heat sink 10 in a conductive or other heat transfer contact with the electronic component or other substrate such as by the bonding of the surface 20 of the layer 16 to a heat transfer surface of the component package.

The body portion 14 of the heat sink 10 is formed of a honeycomb-like material having a hexagonal, such as referenced at 40, or other open cellular structure. Such structure, which is further described, for example, in U.S. Pat. Nos. 3,821,463; 5,895,885; and 5,910,639, may be formed from a stack, referenced at 42, of sheets, one of which is referenced at 44a, of one or more metal foils. The metal foil, which may be the same or different for all or any portion of the sheets 44 in the stack 42, may be, for example, aluminum, tin, copper, gold, silver, bronze, or an alloy or composite thereof, and typically will have a thickness of between about 1–5 mils (25.4–127 µm). The cells 40 may be generally hexagonal as mentioned, but alternatively may be round, square, or of other geometric shape.

Figure 2:
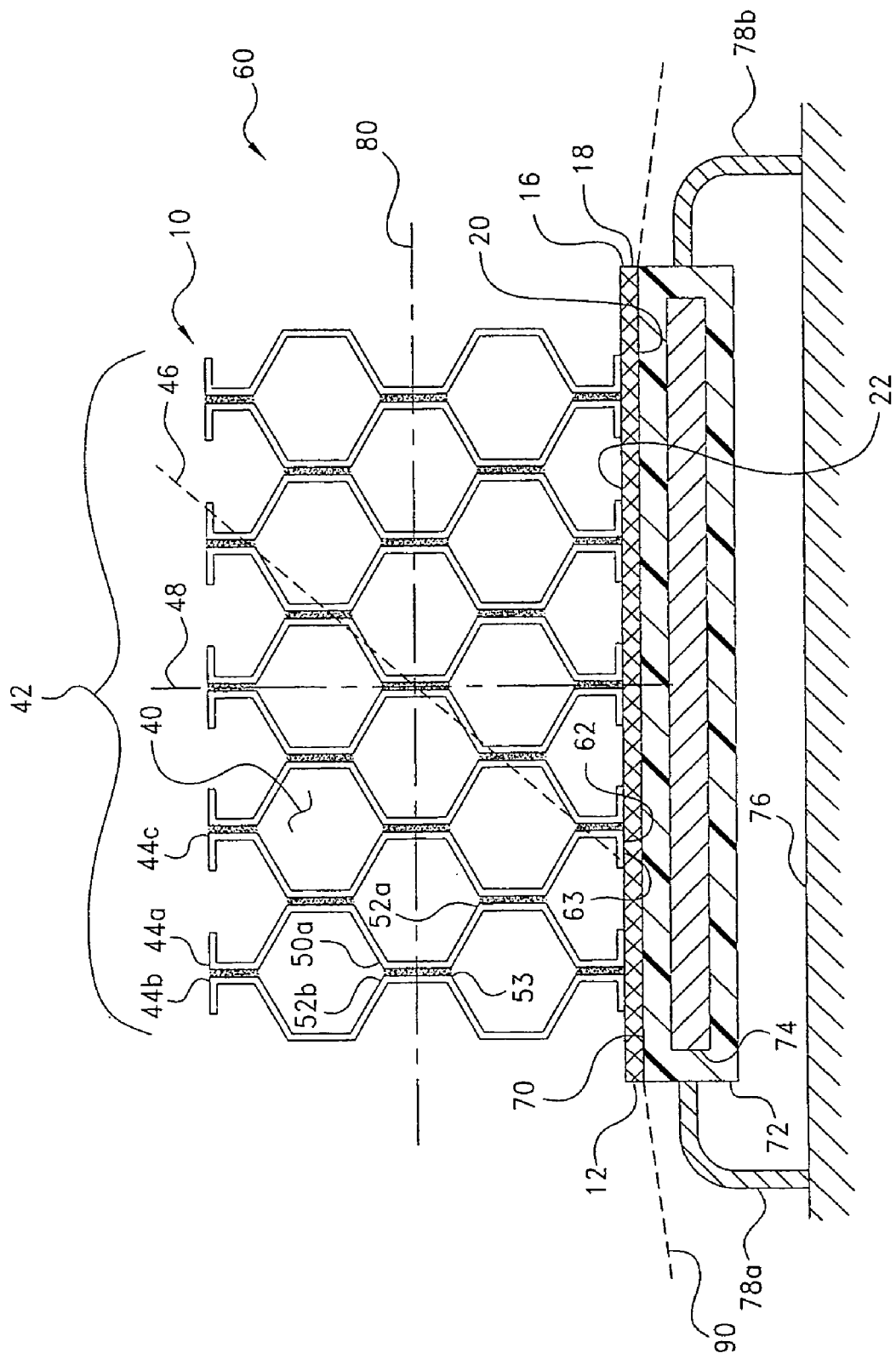
FIG. 2 is a cross-sectional view of the heat sink of FIG. 1 taken through line 2—2 of FIG. 1, and additionally as attached to a surface of the package of an electronic component.

As may be seen best with additional reference to the cross-sectional view of FIG. 2, each of the sheets 44 is corrugated along a longitudinal or lengthwise extent, 46, of the sheet to form, relative to a first transverse extent or height, 48, extending normal to the longitudinal extent 46, an alternating series of crests, one of which is referenced at 50a, and troughs, one of which is referenced at 52a. The lengthwise extents of each of the crests 50 of the sheets 44 in the stack 42 are bonded or otherwise joined, such as with an adhesive or solder, or by laser or spot welding, either continuously or discontinuously, i.e., spot-wise, along the lengthwise extent of a corresponding trough, 52b, of an adjacent sheet 44 in the stack 42 along a series of bondlines, one of which is referenced at 53, with such bondlines 53 between adjacent pairs of sheets, such as between sheets 44a and 44b, and between sheets 44a and 44c, being staggered. Laid-up and bonded as described, the stack 42 forms an integral and lightweight, yet strong, honeycomb-like cellular structure for the mass of the body portion 14 which may be cut or otherwise sized or section to fit the boundaries of the base portion 12 to which it will be attached, although the body portion also may be sized to be of extents that are smaller or larger than the base portion 12.

With reference now primarily to the cross-sectional assembly view of FIG. 2 wherein heat sink 10 is shown as used within the thermal management assembly referenced at 60, for attachment to the base portion 12, the ends of one or more of the sides, such as the side referenced at 62, of the body portion 12 may be flattened as shown at 63. With the material of the layer 16 of the base portion 12 being provided as a PSA or other inherently tacky material, or with a separate adhesive layer being provided, the side 60 of the base portion 12 may be bonded or otherwise joined to the surface 22 thereof to form the integral structure of the heat sink 10. In this regard, in order to reduce thermal impedance across the heat sink 10 and to thereby provide optimum heat transfer efficiency, the structure of the body portion 14 may be oriented relative to the base portion 12 such that the transverse extent 48 of each of the sheets 44 in the stack 42 extends generally normal to the surface 22 of base portion 12. In this way, direct thermal pathways may be effected from the base portion 12 along each of the individual foil sheets 44 in the structure, i.e., without the pathways having to cross the higher thermal resistance bondlines 53 which otherwise would result in increased thermal impedance for the heat sink 10.

With the heat sink 10 being constructed as described, the surface 20 of the base portion 12 may be bonded to or other disposed in heat transfer contact with a heat transfer surface, 70, of the package, 72, of an encapsulated IC microchip, microprocessor, transistor, or other power semiconductor die, 74, or other heat-generating electronic component, subassembly, or source such as a diode, relay, resistor, transformer, amplifier, diac, or capacitor, which package 72 may be formed of plastic, metal, ceramic, or a composite thereof. As may be seen in FIG. 2, the packaged component 72 is mounted on a PCB or other substrate, 76, such as via one or more pins, 78a–b, solder balls, or other means of attachment. As shown, the base portion 12 may be sized to match the boundaries of the surface 70, but also may be made smaller or even to extent beyond those boundaries. Indeed, the size and shape of base portion 12 is not especially critical so long as a sufficient contact area, i.e., "footprint," is provided with the surface 70, and in this regard the base portion itself may be discontinuous, such as in the form of one or more "stripes," or of other configuration such as a "picture frame."

The other dimensions of the heat sink 10, such as the height, i.e., relative to the transverse extent 48, length, i.e., relative to the longitudinal extent 46, and width, i.e., relative to a second transverse extent, 80, normal to the extents 46 and 48, may be sized in accordance with boundaries of the heat transfer surface 70, and otherwise with the available envelope within the device or equipment within with the heat sink 10 will be used. In this regard, the size and shape of the heat sink 10 is not especially critical so long as an adequate heat transfer surface is provided for the particular application involved. By "adequate," it is meant that the heat sink 10 is effective to reduce the surface temperature of the packaged IC chip 74 or other electronic component, which may have an operating temperature range of between about 60–120°, by from about 50–100° C. Of course, it will be appreciated that the thermal dissipation capability of heat sink 10 will be generally proportional to the size of the body portion 14 member 12. Heat sink 10 additionally is of a relatively light weight which may range from about 0.3–0.5 g/cm$^2$) for the materials specified herein, and may be enhanced with convective air circulation to further ensure that the operating temperature of the component 74 is maintained below specified limits.

In a fast "peel and stick" application, the heat transfer surface 70 of the package 72 first may be wiped clean with an organic solvent. With release liner 30 (FIG. 1) removed to expose surface 20 (or a PSA layer thereon) of the layer 16 of base portion 12, heat sink 10 may be bonded under a moderate pressure, i.e., between about 10–30 psi (0.07–0.20 MPa) applied for about 3–15 seconds, to the heat transfer 70. Advantageously, heat sink 10 may be removed for rework using a knife or the like inserted into the bondline, with any adhesive remaining on the package surface being removable with an organic solvent wipe.

Advantageously, both the base portion 12 and, to some degree as a result of the inherent "spring" in the network structure thereof, the body portion 14 are flexible. Such flexibility allows the body portion 14 of the heat sink 10 to bend, such as along the axis 80, or otherwise conform with the base portion 12 to accommodate curvatures and other deviations in planarity, represented at 90, in the surface 70 of the package 72.

Thus, a unique heat sink is described for mounting to the heat transfer surface of an electronic component particular in applications wherein weight considerations, cost, and performance are of particular interest.

The Example to follow, wherein all percentages and proportions are by weight unless otherwise expressly indicated, is illustrative of the practicing of the invention herein involved, but should not be construed in any limiting sense.

EXAMPLE

A representative heat sink according to the present invention was constructed for characterization. The sample was prepared by cutting a 0.66 inch (1.7 cm) thick sheet of aluminum foil honeycomb into a 1×1 inch (2.5×2.5 cm) square. An 11 mil (0.28 mm) thick layer of an doubled-sided thermal tape (Thermattach™ T411, silicone PSA supported on an expanded aluminum mesh, thermal impedance @<100 psi (7 MPa) of 1.0° C.-in$^2$/W (6.5° C.-cm$^2$/W), Parker Chomerics Division, Woburn, Mass.) was applied to one side of the square. The heat sink sample so constructed weighed about 1.9 g.

The heat sink sample was surface mounted under a hand-applied pressure to a TO-220 power supply run at 6 watts. The assembly were centered within a wind tunnel operated at 100 linear feet per minute (LFM) with the honeycomb openings in the heat sink aligned in the direction of air flow. At steady-state, typically after about 35 minutes, the case temperature of the power supply was recorded.

The experimental results, wherein all temperatures are in ° C., are summarized in Table 1 as compared to a similar size (1×1×0.66 inch (2.5×2.5×1.7 mm)) commercial extruded 56 pin heat sink (Wakefield Thermal Solutions, Inc.).

TABLE 1

Comparative Thermal Performance of Experimental Honeycomb and Commercial Pin Fin Heat Sinks

| Sample | Size (cm) | $T_{case}$ (° C.) |
| --- | --- | --- |
| No Dissipator | — | 196 |
| Honeycomb | 2.5 × 2.5 × 1.7 | 98 |
| Pin Fin | 2.5 × 2.5 × 1.7 | 101 |

The foregoing results confirm that the heat sinks of the present invention perform comparably to conventional plate-fin heat sinks of similar size, but at an over 6× reduction in weight.

As it is anticipated that certain changes may be made in the present invention without departing from the precepts herein involved, it is intended that all matter contained in the foregoing description shall be interpreted as illustrative and not in a limiting sense. All references including any priority documents cited herein are expressly incorporated by reference.

What is claimed is:

1. A heat sink disposable on a heat transfer surface, the heat sink comprising:

a base portion having a first surface disposable on the heat transfer surface, and a second surface opposite the first surface, the base portion comprising a thermally-conductive layer, the thermally-conductive layer comprising a compound; and a body portion having a first side and a second side joined to the second surface of the base portion, the body portion comprising a stack of corrugated sheets of one or more metal foils arranged to form a cellular structure, and the second side being formed as a series of ends.

2. The heat sink of claim 1 wherein the compound is inherently tacky.

3. The heat sink of claim 1 wherein the compound comprises an admixture of a continuous phase component and a dispersed phase component.

4. The heat sink of claim 3 wherein the continuous phase component is selected from the group consisting of resins, greases, waxes, and combinations thereof.

5. The heat sink of claim 3 wherein the continuous phase component comprises a pressure sensitive adhesive (PSA) resin.

6. The heat sink of claim 3 wherein the dispersed phase component comprises a particulate filler.

7. The heat sink of claim 6 wherein the particulate filler is selected from the group consisting of boron nitrides, titanium diborides, aluminum nitrides, silicon carbides, graphites, metals, metal oxides, ferrites, and combinations thereof.

8. The heat sink of claim 1 wherein the thermally-conductive layer comprises a carrier, the compound being supported on the carrier.

9. The heat sink article of claim 8 wherein the carrier comprises a sheet of a metal mesh.

10. The heat sink of claim 1 wherein each of the metal foil sheets has a longitudinal extent and a transverse extent normal to the longitudinal extent, and is corrugated along the longitudinal extent to form, relative to the transverse extent, an alternating series of crests and troughs, the lengthwise extent of each of the crests being joined along the lengthwise extent of a corresponding trough of an adjacent sheet in the stack along a series of bondlines, such bondlines between adjacent pairs of sheets being staggered.

11. The heat sink of claim 10 wherein the body portion is oriented relative to the base portion such that the transverse extent of each of the sheets extends generally normal to the base portion.

12. A thermal management assembly comprising:
a heat transfer surface; and
a heat sink disposed on the heat transfer surface, the heat sink comprising:
  a base portion having a first surface disposed in heat transfer contact with the heat transfer surface, and a second surface opposite the first surface, the base portion comprising a thermally-conductive layer, the thermally-conductive layer comprising a compound; and
  a body portion having a first side and a second side joined to the second surface of the base portion, the body portion comprising a stack of corrugated sheets of one or more metal foils arranged to form a cellular structure, and the second side being formed as a series of ends.

13. The assembly of claim 12 wherein the compound is inherently tacky such that the base portion self adheres to the heat transfer surface.

14. The assembly of claim 12 wherein the compound comprises an admixture of a continuous phase component and a dispersed phase component.

15. The assembly of claim 14 wherein the continuous phase component is selected from the group consisting of resins, greases, waxes, and combinations thereof.

16. The assembly of claim 14 wherein the continuous phase component comprises a pressure sensitive adhesive (PSA) resin.

17. The assembly of claim 14 wherein the dispersed phase component comprises a particulate filler.

18. The assembly of claim 17 wherein the particulate filler is selected from the group consisting of boron nitrides, titanium diborides, aluminum nitrides, silicon carbides, graphites, metals, metal oxides, ferrites, and combinations thereof.

19. The assembly of claim 12 wherein the thermally-conductive layer further comprises a carrier, the compound being supported on the carrier.

20. The assembly of claim 19 wherein the carrier comprises a sheet of a metal mesh.

21. The assembly of claim 12 wherein each of the metal foil sheets of the heat sink body portion has a longitudinal extent and a transverse extent normal to the longitudinal extent, and is corrugated along the longitudinal extent to form, relative to the transverse extent, an alternating series of crests and troughs, the lengthwise extent of each of the crests being joined along the lengthwise extent of a corresponding trough of an adjacent sheet in the stack along a series of bondlines, such bondlines between adjacent pairs of sheets being staggered.

22. The assembly of claim 21 wherein the body portion is oriented relative to the base portion such that the transverse extent of each of the sheets extends generally normal to the base portion.

23. The assembly of claim 12 wherein the heat transfer surface is non-planar, and the heat sink base portion and body portion arc flexible relative the longitudinal extents of the sheets to conform to the non-planarity of the heat transfer surface.

24. A method of transferring heat from a heat transfer surface comprising the steps of:
  (a) providing a heat sink comprising:
    a base portion having a first surface and a second surface opposite the first surface, the base portion comprising a thermally-conductive layer, the thermally-conductive layer comprising a compound; and
    a body portion having a first side and a second side joined to the second surface of the base portion, the body portion comprising a stack of corrugated sheets of one or more metal foils arranged to form a cellular structure, and the second side being formed as a series of ends, and
  (b) disposing the first surface of the heat sink base portion on the heat transfer surface.

25. The method of claim 24 wherein the compound is inherently tacky such that the base portion self adheres to the heat transfer surface.

26. The method of claim 24 wherein the compound comprises an admixture of a continuous phase component and a dispersed phase component.

27. The method of claim 26 wherein the continuous phase component is selected from the group consisting of resins, greases, waxes, and combinations thereof.

28. The method of claim 26 wherein the continuous phase component comprises a pressure sensitive adhesive (PSA) resin.

29. The method of claim 24 wherein the thermally-conductive layer further comprises a carrier, the compound being supported on the carrier.

30. The method article of claim 29 wherein the carrier comprises a sheet of a metal mesh.

31. The method of claim 26 wherein the dispersed phase component comprises a particulate filler.

32. The method of claim 31 wherein the particulate filler is selected from the group consisting of boron nitrides, titanium diborides, aluminum nitrides, silicon carbides, graphites, metals, metal oxides, ferrites, and combinations thereof.

33. The method of claim 24 wherein each of the metal foil sheets of the heat sink body portion has a longitudinal extent and a transverse extent normal to the longitudinal extent, and is corrugated along the longitudinal extent to form, relative to the transverse extent, an alternating series of crests and troughs, the lengthwise extent of each of the crests being joined along the lengthwise extent of a corresponding trough of an adjacent sheet in the stack along a series of bondlines, such bondlines between adjacent pairs of sheets being staggered.

34. The method of claim 33 wherein the body portion is oriented relative to the base portion such that the transverse extent of each of the sheets extends generally normal to the base portion.

35. The method of claim 24 wherein the heat transfer surface is non-planar, and the heat sink base portion and body portion are flexible relative the longitudinal extents of the sheets to conform to the non-planarity of the heat transfer surface.

* * * * *